(12) United States Patent
Barth, Jr. et al.

(10) Patent No.: US 6,957,372 B2
(45) Date of Patent: Oct. 18, 2005

(54) REPAIR OF ADDRESS-SPECIFIC LEAKAGE

(75) Inventors: John Edward Barth, Jr., Williston, VT (US); Paul Christian Parries, Wappingers Falls, NY (US); Norman Whitelaw Robson, Hopewell Junction, NY (US)

(73) Assignees: International Business Machines Corporation, Armonk, NY (US); Infineon Technologies, AG, Munich (DE)

( * ) Notice: Subject to any disclaimer, the term of this patent is extended or adjusted under 35 U.S.C. 154(b) by 392 days.

(21) Appl. No.: 10/228,152

(22) Filed: Aug. 26, 2002

(65) Prior Publication Data

US 2004/0039535 A1 Feb. 26, 2004

(51) Int. Cl.⁷ .......................... G06F 11/00; G11C 29/00
(52) U.S. Cl. ...................... 714/733; 714/710; 714/718; 365/201
(58) Field of Search ................................ 714/718, 179, 714/721, 710, 711, 733, 734, 736; 365/226, 365/200, 201, 203, 204, 189.07

(56) References Cited

U.S. PATENT DOCUMENTS

| | | | |
|---|---|---|---|
| 4,752,699 A | | 6/1988 | Cranford, Jr. et al. |
| 5,453,959 A | | 9/1995 | Sakuta, et al. |
| 5,764,655 A | * | 6/1998 | Kirihata et al. ............. 714/733 |
| 5,847,614 A | | 12/1998 | Gilbert, et al. |
| 5,940,283 A | | 8/1999 | Mihara, et al. |
| 6,075,739 A | | 6/2000 | Ihara |
| 6,182,257 B1 | * | 1/2001 | Gillingham ................. 714/733 |
| 6,185,712 B1 | * | 2/2001 | Kirihata et al. ............. 714/732 |
| 6,272,653 B1 | * | 8/2001 | Amstutz ..................... 714/724 |
| 6,560,141 B2 | * | 5/2003 | Osada et al. ................ 365/154 |

* cited by examiner

Primary Examiner—Christine T. Tu
(74) Attorney, Agent, or Firm—Ira D. Blecker

(57) ABSTRACT

An integrated circuit having a DRAM array connected to a power supply is tested for excessive current draw by selectively applying voltage to a single wordline or bitline, measuring current drawn, comparing the result with a reference number representing acceptable leakage, and replacing columns of the array having excessive leakage, thereby identifying and repairing latent defects that may become a cause of failure.

18 Claims, 2 Drawing Sheets

REPAIR OF ADDRESS-SPECIFIC LEAKAGE

TECHNICAL FIELD

The field of the invention is that of testing integrated circuits having on-chip power supplies.

BACKGROUND OF THE INVENTION

Testing integrated circuits, has become both more difficult and more important as the complexity of the circuits has increased.

The amount of resources spent in conventional burn-in and functional margin testing accounts for a non-trivial fraction of chip manufacturing cost. Sending a chip through a thermal cycle and testing it with a highly expensive automated tester is an expense that can be avoided if the chip can be eliminated by a less expensive method.

In addition, there is a class of latent defects that do not show up as fatal flaws in a conventional test, but have a high probability of causing the chip to fail.

In the past, excessive current draw has been tested by applying a voltage to the module or chip through a resistor and measuring the voltage drop across the test resistor. This procedure requires extra wiring on the chip that consumes space.

Some circuits employ Built-In Self-Test modules (BIST) that consume silicon area but permit testing a number of chips simultaneously.

The art could benefit from a simple and inexpensive testing technique adapted to identify chips with a high probability of failing.

SUMMARY OF THE INVENTION

The invention relates to integrated circuits having DRAM arrays for identifying portions of the array that draw current above their design specifications.

A feature of the invention is use of a BIST system present on the chip for testing individual elements in the array.

Another feature of the invention is the use of circuit elements already present in the chip for testing.

Yet another feature of the invention is a digital measurement of current draw by counting cycles of the charge pump.

DETAILED DESCRIPTION

Figure 1:
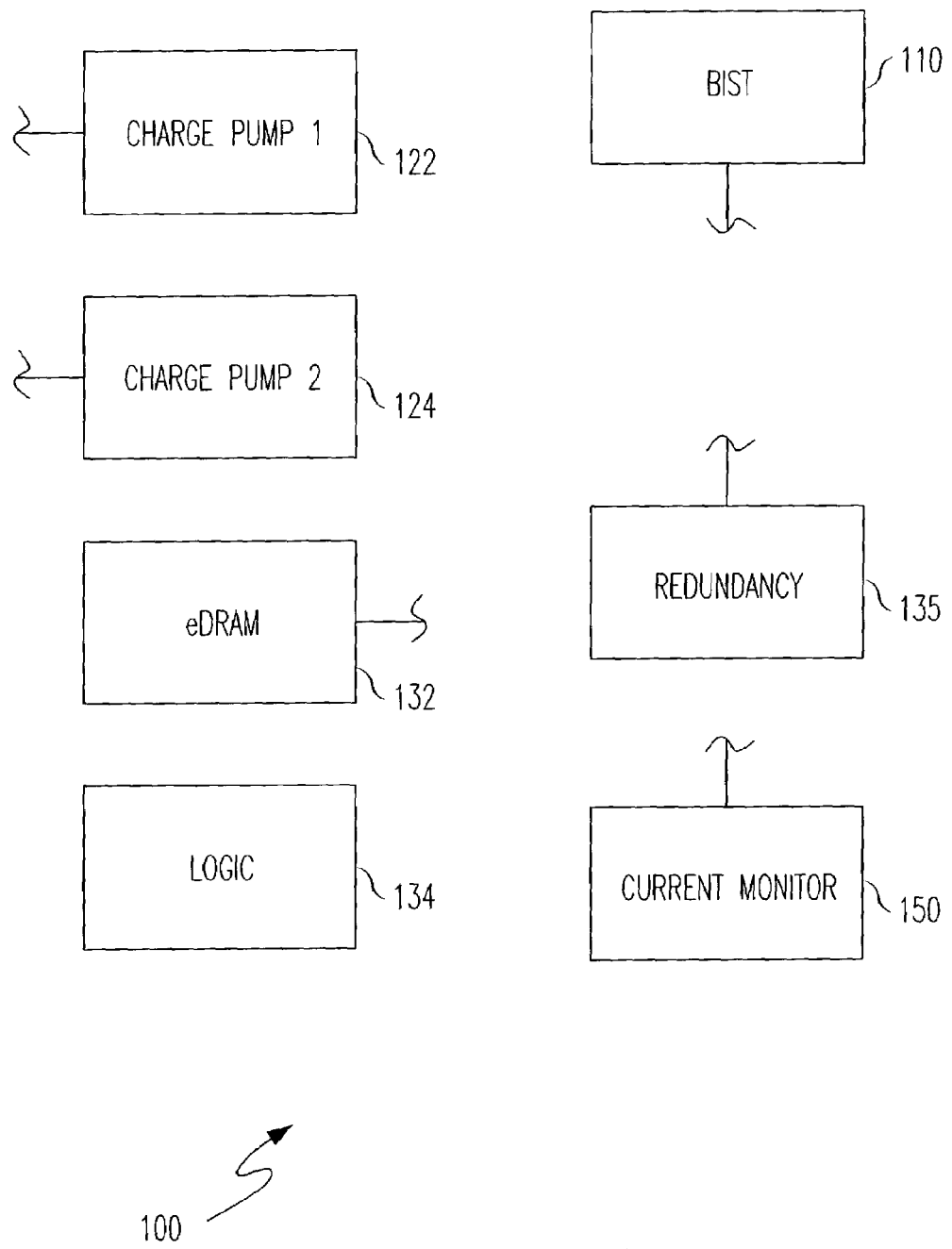
FIG. 1 illustrates schematically a testing system according to the invention.

FIG. 1 illustrates schematically an integrated circuit 100 according to the invention having an embedded DRAM module 132 and a logic module 134. Logic module 134 may be a controller or CPU or many other systems for performing various data processing operations.

Illustratively, the wordline networks of the DRAM array are powered by an on-chip power supply 122 or 124 (e. g. a charge pump). Current monitor 150, described below, measures the current drawn from one or the other charge pumps. Optionally, monitor 150 can measure current drawn by circuit elements selected by the BIST. This feature makes dual use of a component of the on-chip power supply system to aid in the functions of the BIST.

Box 135, labeled Redundancy, represents redundant columns of the DRAM array, together with fuses for disabling defective columns and replacing them with spares.

At the upper right of the Figure, BIST 110 represents a self-testing system according to the invention. This system performs the usual functions known to the prior art, such as applying test vectors to the array cells to test for defects. A BIST typically tests for stuck faults, pattern sensitivity, bias and timing sensitivity.

Preferably, the DRAM array includes a scan chain having a register for holding the scan output.

In addition, BIST 110 according to the invention further contains logic to activate (apply voltage to) individual wordlines and for connecting current monitor 150 to the appropriate power supply 122 or 124 to detect excessive current draw above an empirical threshold. The system will detect short circuits also, but the purpose of setting a limit is to detect latent shorts that are likely to develop into actual failures in operation. Replacing array elements that have weak spots in the insulation or other potential shorts during testing eliminates the high cost of identifying and replacing chips that fail during operation. Typically only rows are replaced since all columns are activated whenever a row is activated. Entire array blocks could be replaced if the memory architecture allowed.

When a row is activated, the current draw in the wordline power networks would be measured. If there is a short from the wordline to the bitline or from wordline to wordline, a high current will be detected when the defective wordline is activated. If there is a latent defect, the wordline will draw less current than a short, but higher than the design specification. Redundancy can replace rows and/or columns. Rows are replaced by activating redundant rows in place of the failing rows. Columns are replaced by steering data from the defective column to a redundant column.

A latent wordline to bitline short may be seen to cause a test failure on the bitline, but since the wordline is less susceptible to leakage than the bitline, the wordline may not fail initially. The leakage of such a marginal short may increase over time and eventually lead to additional functional failure on the wordline In operation, BIST 110, acting through a multiplexer, feeds a dummy address to the input of the address decoder, which applies voltage to each wordline in sequence while the BIST tests the magnitude of the current drawn against a threshold for a short and a latent short.

If a leaky element is found that can be repaired, redundancy module 135 is activated to replace the defective element.

Figure 2:
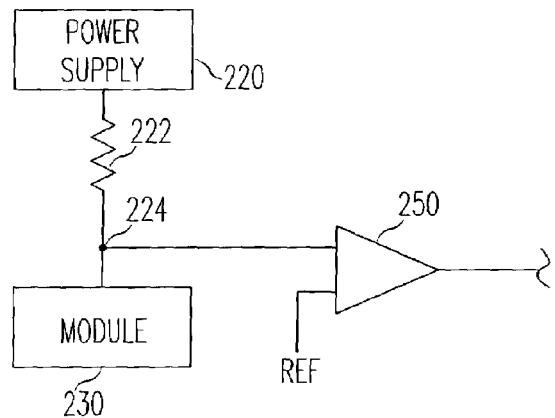
FIG. 2 illustrates schematically a current measurement system for use with the invention.

Referring now to FIG. 2, a current measuring system suitable for use with the invention is illustrated. Power supply 220 feeds its output through resistor 222 to module 230. Module 230 may be the DRAM array or a logic module. A single pump may feed more than one module. Comparator 250 compares the voltage at node 224 with a reference voltage. The reference voltage is chosen to identify weak modules that are likely to develop shorts during operation, not just evident short circuits. Choosing a value for the rejection criterion will depend on a judgment call balancing the cost of field repair and replacement versus the lost revenue from chips that do not develop shorts in operation.

Figure 3:
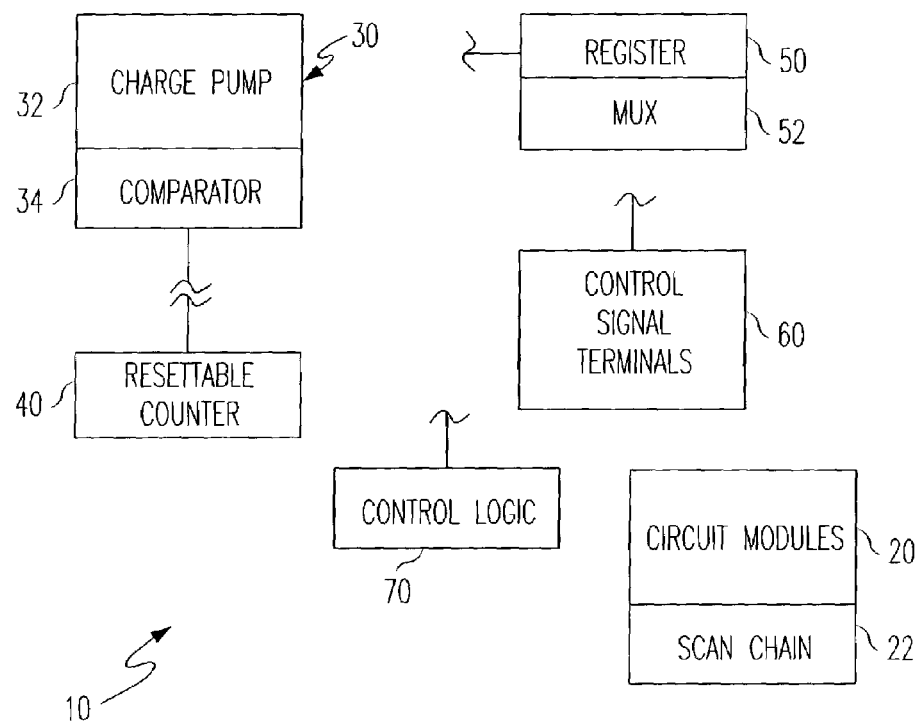
FIG. 3 illustrates schematically an alternative current measurement system for use with the invention.

An alternative current measuring system is shown in FIG. 3, which illustrates schematically an integrated circuit 10 having a set of circuit modules 20 that perform the function of the chip. Illustratively, boxes 50, 52, 60 and 70 in FIG. 3 represents elements of BIST 110 in FIG. 1, DRAM 132 of FIG. 1 is one of modules 20 of FIG. 3 and power supply 30 of FIG. 3 is one of supplies 122 and 124 of FIG. 1. Those skilled in the art are aware that the expression of functions in a block diagram may be done in more than one way and the labels on a block diagram do not correspond necessarily with the functions of various circuit elements.

At least one of these modules is powered by an on-chip power supply 30 including charge pump 32 and comparator 34. Conventionally, comparator 34 compares the voltage on the module or network being supplied by the charge pump and starts and stops the pump as required to maintain the voltage within a specified tolerance.

The comparator is used as a test element by counting the number of times the pump cycles within some interval. Counter 40 responds to any convenient control signal (e.g. the output from comparator 34). At the end of a test interval, the sum in counter 40 is transferred through optional multiplexer 52 to register 50. Preferably, register 50 is the output register for the scan chain 22 in FIG. 3 with DRAM 132 of FIG. 1 being one of circuit modules 20 in FIG. 3, so that the same silicon area may be used for both tests.

The number in register 50 is read by BIST 10 (or by an external tester) and compared with a reference that has been determined empirically to represent maximum acceptable leakage, similarly to the system of FIG. 2.

The magnitude of the counting interval does not matter because the empirical number will be set appropriately before volume production begins (and may be changed in response to data from the field).

Preferably, counter 40 will be started and stopped in response to externally applied control signals on terminals 60, so that there is no need to provide a timer on-chip. The BIST is cycled by an external clock so a cycle count timer can be implemented in the BIST.

Box 60 represents terminals for control signals to be applied to BIST 110 of FIG. 1 and multiplexers to share the terminals with interconnections that are used during normal operation, e.g. address terminals for the DRAM array. Box 60 also represents registers and other storage elements as required to hold control signals and/or test data. A BIST will optionally store data to be analyzed later, whether within the BIST or by an off-chip system.

Those skilled in the art will readily be able to implement the present invention in the light of the disclosure herein, using conventional implementations of charge pumps, counters, registers and the like. The invention is not confined to DRAMs and may be applied to SRAMs or other types of memories and to other types of system on a chip that, whether or not the system includes redundant elements that can substitute for active or latent shorts or other defects; i.e. the invention may be used to reject chips containing latent defects, rather than repairing them. When examining a chip according to the invention, the sequence may be either that a defective element is replaced immediately upon detection, or the location of the defective element may be stored and the replacement done later, at the option of the system designer.

While the invention has been described in terms of a single preferred embodiment, those skilled in the art will recognize that the invention can be practiced in various versions within the spirit and scope of the following claims.

What is claimed is:

1. An integrated circuit having at least one circuit module connected to at least one on-chip power supply, said circuit containing measurement means for controlling operation of said power supply in response to current leakage;
   a BIST system for testing operation of said circuit, said BIST system having control means for testing current drain in selected circuit modules; in which said circuit includes a memory array and redundancy means for replacing selected elements in said memory array;
   said BIST further comprises means for selectively applying voltage to a word line within said memory array, whereby said means for testing current drain may test for current drain from said wordline; and
   said BIST includes control circuitry to control said redundancy means to replace a defective element; and
   said BIST includes means for replacing an element associated with said wordline when said current drawn exceeds a reference value that is less than a short circuit current.

2. A circuit according to claim 1, in which said memory array is a DRAM array.

3. A circuit according to claim 2, in which said redundancy means includes means for replacing a row of memory cells.

4. A circuit according to claim 2, in which said redundancy means includes means for replacing a column of memory cells.

5. An integrated circuit comprising:
   at least one circuit module:
   current measurement means for measuring current drawn by said at least one circuit module;
   a BIST system for testing operation of said circuit, said BIST system having control means for testing current drain in selected circuit modules; and
   said BIST system having means for identifying circuit modules that draw current in excess of a reference value that is less than a current drawn by a short circuit, whereby said BIST has the capability of identifying latent short circuits.

6. A circuit according to claim 5, in which one of said circuit modules is a memory array.

7. A circuit according to claim 6, in which one of said circuit modules is a DRAM array.

8. A circuit according to claim 5, further including redundancy means for replacing selected circuit modules.

9. A circuit according to claim 5, in which said circuit includes a scan chain;
   said circuit includes a scan output register for holding a result from said scan chain;
   said means for testing current drain includes a digital output and means for storing said digital output in one of said scan chain and said scan output register; and
   said circuit further includes means for storing one of said result from said scan chain and said digital output in said scan output register, whereby said BIST may selectively replace elements of said memory array without external action.

10. A method of testing an integrated circuit having a BIST system and at least one circuit module connected to a power supply, said circuit containing means for testing current leakage in a selected circuit module and redundancy means for replacing a selected circuit module, comprising the steps of;

selectively connecting said power supply to a circuit module;

measuring a current value of current drawn through said circuit module;

comparing said current value with a reference value that is less than a short circuit current; and replacing an element of said circuit module with a redundant element when said current value of current drawn exceeds said reference value.

11. A method according to claim 10, in which said redundant element is an array of memory cells.

12. A method according to claim 10, in which said redundant element is a row of memory cells.

13. A method according to claim 10, in which said current value is stored in a scan output register of a scan chain in said integrated circuit.

14. A method of testing an integrated circuit having a BIST system and a memory array connected to a power supply, said circuit containing means for controlling operation of said power supply in response to current leakage, comprising the steps of;

selectively connecting said power supply to an element of said memory array;

measuring a current value of current drawn through said element;

comparing said current value with a reference value; and replacing said element with a redundant element when said current value exceeds said reference value; in which said step of measuring said current value is effected by the steps of resetting a counter and counting the sum of a number of times said means for controlling operation of said power supply in response to current leakage turns on in a test interval.

15. A method according to claim 14, in which said threshold value is less than a short circuit current.

16. An integrated circuit comprising:

at least one circuit module:

current measurement means for measuring current drawn by said at least one circuit module;

a BIST system for testing operation of said circuit, said BIST system having testing means responsive to said current measurement means for testing current drawn by a selected circuit module; and said BIST system having means for identifying circuit modules that draw current in excess of a reference value that is less than a current drawn by a short circuit, whereby said BIST has the capability of identifying latent short circuits.

17. A circuit according to claim 16, in which one of said circuit modules is a memory array and further including redundancy means for replacing a selected circuit module, whereby said circuit has the capability of replacing a circuit module containing a latent short circuit.

18. A circuit according to claim 16, in which said circuit includes a scan chain;

said circuit includes a scan output register for holding a result from said scan chain;

said means for testing current drawn by a selected circuit module includes a digital output and means for storing said digital output in one of said scan chain and said scan output register; and said circuit further includes means for storing one of said result from said scan chain and said digital output in said scan output register, whereby said BIST has th ecapability of selectively replacing a selected circuit module without external action.

* * * * *